US010259957B2

(12) United States Patent
Park et al.

(10) Patent No.: US 10,259,957 B2
(45) Date of Patent: Apr. 16, 2019

(54) UV-CURABLE INK COMPOSITION, METHOD FOR PRODUCING BEZEL PATTERN OF DISPLAY SUBSTRATE USING SAME, AND BEZEL PATTERN PRODUCED THEREBY

(71) Applicant: LG CHEM, LTD., Seoul (KR)

(72) Inventors: Sung-Eun Park, Daejeon (KR); Yong-Sung Goo, Daejeon (KR); Seung-A Back, Daejeon (KR); Joon-Hyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/514,362

(22) PCT Filed: Sep. 30, 2015

(86) PCT No.: PCT/KR2015/010346
§ 371 (c)(1),
(2) Date: Mar. 24, 2017

(87) PCT Pub. No.: WO2016/048120
PCT Pub. Date: Mar. 31, 2016

(65) Prior Publication Data
US 2017/0283634 A1 Oct. 5, 2017

(30) Foreign Application Priority Data

Sep. 26, 2014 (KR) .................. 10-2014-0129417
Sep. 30, 2015 (KR) .................. 10-2015-0138099

(51) Int. Cl.
| | |
|---|---|
| *C08F 2/46* | (2006.01) |
| *C08F 2/50* | (2006.01) |
| *C08G 61/04* | (2006.01) |
| *C09D 11/101* | (2014.01) |
| *B41M 7/00* | (2006.01) |
| *C09D 11/03* | (2014.01) |
| *C09D 11/102* | (2014.01) |
| *C09D 11/36* | (2014.01) |
| *C09D 11/38* | (2014.01) |
| *B41F 17/00* | (2006.01) |
| *C09D 11/037* | (2014.01) |
| *C09D 11/324* | (2014.01) |
| *G09F 9/00* | (2006.01) |
| *C08F 2/48* | (2006.01) |
| *B41J 11/00* | (2006.01) |
| *H05K 1/09* | (2006.01) |
| *H05K 3/12* | (2006.01) |
| *C09D 11/00* | (2014.01) |
| *C09D 171/00* | (2006.01) |

(52) U.S. Cl.
CPC .......... *C09D 11/101* (2013.01); *B41F 17/006* (2013.01); *B41J 11/002* (2013.01); *B41M 7/00* (2013.01); *B41M 7/009* (2013.01); *C08F 2/48* (2013.01); *C09D 11/00* (2013.01); *C09D 11/03* (2013.01); *C09D 11/037* (2013.01); *C09D 11/102* (2013.01); *C09D 11/324* (2013.01); *C09D 11/36* (2013.01); *C09D 11/38* (2013.01); *C09D 171/00* (2013.01); *G09F 9/00* (2013.01); *H05K 1/092* (2013.01); *H05K 3/12* (2013.01); *H05K 3/125* (2013.01); *H05K 3/1275* (2013.01); *H05K 2203/0534* (2013.01)

(58) Field of Classification Search
CPC ... C09D 11/101; C09D 11/324; C09D 11/102; C09D 11/38; B41J 11/002; B41M 7/009; H05K 1/092; H05K 3/125; H05K 2203/0534; H05K 3/12; H05K 3/1275
USPC ...................... 522/6, 71, 189, 184, 1; 520/1
See application file for complete search history.

(56) References Cited

U.S. PATENT DOCUMENTS

| | | | | |
|---|---|---|---|---|
| 2007/0247503 A1* | 10/2007 | Fukawa | ............... | C09D 11/101 347/100 |
| 2008/0055379 A1* | 3/2008 | Ishikawa | ................ | B41J 11/002 347/102 |
| 2010/0079568 A1* | 4/2010 | Miura | .................. | B41M 5/0023 347/102 |
| 2011/0195194 A1* | 8/2011 | Loccufier | .............. | C07C 381/12 427/427.4 |
| 2014/0186592 A1* | 7/2014 | Jeon | ......................... | B32B 5/16 428/195.1 |
| 2014/0342129 A1 | 11/2014 | Kim et al. | | |

(Continued)

FOREIGN PATENT DOCUMENTS

| | | | |
|---|---|---|---|
| JP | 2006-089715 | * | 4/2006 |
| JP | 2010-7000 A | | 1/2010 |

(Continued)

OTHER PUBLICATIONS

Miura et al, JP 2006-089715 Machine Translation Part 1, Apr. 6, 2006 (Year: 2006).*
Miura et al, JP 2006-089715 Machine Translation Part 2, Apr. 6, 2006 (Year: 2006).*
Watanabe, JP 2010-013596 Machine Translation, Jan. 21, 2010 (Year: 2010).*

(Continued)

*Primary Examiner* — Jessica Whiteley
(74) *Attorney, Agent, or Firm* — Dentons US LLP

(57) ABSTRACT

The present invention relates to a UV-curable ink composition, a method for producing a bezel pattern of a display substrate using same, and a bezel pattern produced thereby, the UV-curable ink composition comprising a colorant, an epoxy compound, an oxetane compound and a photopolymerization initiator, wherein a content ratio of the epoxy compound to the oxetane compound is 1:0.5 to 1:6 and the curing dose amount of the ultraviolet curable ink composition is 20 to 5,000 mJ/cm².

33 Claims, No Drawings

(56) References Cited

U.S. PATENT DOCUMENTS

| | | | | |
|---|---|---|---|---|
| 2014/0362152 | A1* | 12/2014 | Fukumoto | C09D 11/101 347/102 |
| 2015/0125789 | A1 | 5/2015 | Park et al. | |
| 2017/0198157 | A1* | 7/2017 | Park | B41M 7/00 |
| 2017/0218212 | A1* | 8/2017 | Park | B41M 7/00 |
| 2017/0227844 | A1* | 8/2017 | Park | C08G 59/32 |
| 2017/0275480 | A1* | 9/2017 | Park | B41M 7/00 |
| 2017/0283633 | A1* | 10/2017 | Park | B41M 7/00 |
| 2017/0298241 | A1* | 10/2017 | Park | B41M 7/00 |

FOREIGN PATENT DOCUMENTS

| | | | |
|---|---|---|---|
| JP | 2010-013596 | * | 1/2010 |
| JP | 2010-13596 A | | 1/2010 |
| JP | 2010-106254 A | | 5/2010 |
| JP | 2013-147568 A | | 8/2013 |
| JP | 2014-148580 A | | 8/2014 |
| KR | 10-2013-0132322 A | | 12/2013 |
| KR | 10-2014-0086584 A | | 7/2014 |
| WO | 2014/010884 A1 | | 1/2014 |

* cited by examiner

UV-CURABLE INK COMPOSITION, METHOD FOR PRODUCING BEZEL PATTERN OF DISPLAY SUBSTRATE USING SAME, AND BEZEL PATTERN PRODUCED THEREBY

TECHNICAL FIELD

This application is a National Stage Application of International Application No. PCT/KR2015/010346 filed on Sep. 30, 2015, which claims the benefit of Korean Patent Application No. 10-2014-0129417 filed on Sep. 26, 2014 and Korean Patent Application No. 10-2015-0138099 filed on Sep. 30, 2015, all of which are hereby incorporated by reference in their entirety for all purposes as if fully set forth herein.

The present invention relates to a UV-curable ink composition, a method for producing a bezel pattern of a display substrate using the same, and a bezel pattern produced thereby.

BACKGROUND ART

In a display device, a method for forming a bezel pattern on a substrate has been used instead of using a separate bezel structure in order to achieve the weight reduction and thinning.

In the method for producing a display substrate in the related art, a photolithography method or a screen printing method is used in order to form a bezel pattern. But in the case of the photolithography method, there is a disadvantage in that the production costs for forming a pattern are expensive, and the process is complicated. In the case of the screen printing method, the thickness of a formed pattern due to high viscosity of a composition is increased to several tens of μm, and accordingly, a step difference occurs between a pattern formation part and a pattern non-formation part. Furthermore, for a bezel part having a white or gold color instead of a black color, a bezel part is formed by using a method for recoating the color several times in order to obtain an optical density at a proper level, and as the printing frequency of the bezel pattern is increased as described above, the step difference between the pattern formation part and the pattern non-formation part is further increased.

In particular, in the case of a touch panel display in which a bezel pattern is disposed on an internal side surface of a display device, there occurs a problem in that when a transparent conductive film is coated, the conductive film is discontinuously coated or short-circuited. Also, when an upper substrate, for example, a film having an adhesive force such as a polarizing plate, is attached to the surface on which the bezel pattern is formed, if the step difference and the taper angle between the bezel pattern forming portion and the non-forming portion are large, the fine bubbles may be generated, or the entire film may be peeled off, which may impair visual quality. The cause of the release may occur when the restoring force of the film deformed at the time of adhering is larger than the adhesive force between the film and the pattern forming portion or the adhesive force between the film and the pattern forming portion.

Therefore, there is a need to develop a method in which adhesion with a film is improved as compared with the conventional method of forming a bezel pattern.

DISCLOSURE

Technical Problem

Therefore, the present invention has been made keeping in mind the above problems encountered in the related art, and an object of the present invention is to provide a method for producing a bezel pattern, which may not exhibit a short-circuit due to a large step difference and deterioration in appearance quality due to generation of bubbles and release of the film by using an UV-curable ink composition having a small taper angle and a thin film thickness when the composition is cured to form a bezel pattern, a bezel pattern produced thereby, and a display substrate comprising the same.

When the bezel pattern is cured with ultraviolet rays, the display element may experience degeneration of the constituent material when it receives ultraviolet rays. Therefore, it is more preferable to appropriately adjust the dose amount of ultraviolet rays (accumulated light amount=mW/cm$^2$× sec=mJ/cm$^2$) and to use a long wavelength ultraviolet ray with low energy if possible.

Technical Solution

In order to solve the above problem, the present invention provides a UV-curable ink composition comprising a colorant, an epoxy compound, an oxetane compound and a photopolymerization initiator, wherein a content ratio of the epoxy compound to the oxetane compound is 1:0.5 to 1:6 and the curing dose amount of the ultraviolet curable ink composition is 20 to 5,000 mJ/cm2. Also, it is possible to use a long-wavelength ultraviolet ray having a low energy of 360 nm to 410 nm, and in particular, to provide a composition capable of being cured by a UV-LED emitting light of a single wavelength.

Further, the present invention provides a method for producing a bezel pattern for a display substrate, comprising: forming a bezel pattern on a substrate by using the UV-curable ink composition; and curing the bezel pattern.

In addition, the present invention provides a bezel pattern for a display substrate, which is formed on a substrate by curing the UV-curable ink composition.

Advantageous Effects

According to the present invention, it is possible to produce a bezel pattern which does not exhibit a short-circuit due to a large step difference and the deterioration in appearance quality according to the generation of bubbles and the release of the film by using a UV-curable ink composition which exhibits a small taper angle and a thin film thickness when the composition is cured to form a bezel pattern.

In the method for producing a bezel pattern of the present invention, the bezel pattern produced by using a UV-curable ink composition comprising a surfactant has excellent adhesion force to a substrate and excellent coating property, and is excellent in adhesion to an upper substrate.

BEST MODE

Hereinafter, the present invention will be described in more detail.

The present invention provides a UV-curable ink composition comprising a colorant, an epoxy compound, an oxetane compound and a photopolymerization initiator, wherein a content ratio of the epoxy compound to the oxetane compound is 1:0.5 to 1:6 and the curing dose amount of the ultraviolet curable ink composition is 20 to 5,000 mJ/cm2, Further, the UV-curable ink composition of the present invention may further comprise one or more selected from the group consisting of a surfactant, an adhesion promoter, a diluent, and a photosensitizer.

In the UV-curable ink composition, a radical polymerizable resin and a cationic polymerizable resin may be usually used. The radical polymerizable resin is not suitable for curing of a thin film because of curing failure due to oxygen, and is not suitable for forming a bezel pattern because curing shrinkage is so large that adhesion to a glass base material is low. In contrast, the cationic polymerizable resin is advantageous in curing a thin film because the resin typically has low curing shrinkage and is slightly affected by oxygen.

The UV-curable ink composition used in the present invention comprises an epoxy compound as a cationic curing component. The epoxy compound may be specifically one or a mixture of two selected from a bisphenol type epoxy compound, a novolac type epoxy compound, a glycidyl ester type epoxy compound, a glycidyl amine type epoxy compound, a linear aliphatic epoxy compound, a biphenyl type epoxy compound, and an alicyclic epoxy compound.

The alicyclic epoxy compound may mean a compound comprising one or more epoxidized aliphatic ring groups.

In the alicyclic epoxy compound comprising an epoxidized aliphatic ring group, the epoxidized aliphatic ring group means an epoxy group bonded to an alicyclic ring. It can exemplify a functional group, such as a 3,4-epoxycyclopentyl group, a 3,4-epoxycyclohexyl group, a 3,4-epoxycyclopentylmethyl group, a 3,4-epoxycyclohexylmethyl group, a 2-(3,4-epoxycyclopentyl)ethyl group, a 2-(3,4-epoxycyclohexyl)ethyl group, a 3-(3,4-epoxycyclopentyl)propyl group or a 3-(3,4-epoxycyclohexyl)propyl group. A hydrogen atom constituting the alicyclic ring may also be optionally substituted with a substituent such as an alkyl group. As the alicyclic epoxy compound, for example, a compound to be specifically exemplified below may be used, but not limited thereto.

For example, it is possible to use dicyclopentadiene dioxide, cyclohexene oxide, 4-vinyl-1,2-epoxy-4-vinyl cyclohexene, vinyl cyclohexene dioxide, limonene monoxide, limonene dioxide, (3,4-epoxycyclohexyl)methyl-3,4-epoxycyclohexane carboxylate, 3-vinylcyclohexene oxide, bis(2,3-epoxycyclopentyl)ether, bis(3,4-epoxycyclohexyl methyl)adipate, bis(3,4-epoxy-6-methylcyclohexyl methyl) adipate, (3,4-epoxycyclohexyl)methyl alcohol, (3,4-epoxy-6-methylcyclohexyl)methyl-3,4-epoxy-6-methylcyclohexane carboxylate, ethylene glycol bis(3,4-epoxycyclohexyl)ether, 3,4-epoxycyclohexene carboxylic acid ethylene glycol diester, (3,4-epoxycyclohexyl)ethyl trimethoxysilane, Celloxide 8000 manufactured by Daicel Corp., and the like.

The content of the epoxy compound may be preferably 5 to 60 wt %, and more preferably 10 to 30 wt %, with respect to a total weight of the UV-curable ink composition. When the content exceeds 60 wt %, the coatability deteriorates, and when the content is less than 5 wt %, the sensitivity deteriorates.

The UV-curable ink composition comprises an oxetane compound as another cationic polymerizable monomer.

The oxetane compound is a compound having a 4-membered cyclic ether group in a molecular structure thereof, and may serve to lower the viscosity of the cationically cured ink composition, for example, to less than 50 cPs at 25° C.

Specifically, it is possible to use 3-ethyl-3-hydroxymethyl oxetane, 1,4-bis[(3-ethyl-3-oxetanyl)methoxymethyl]benzene, 3-ethyl-3-(phenoxymethyl)oxetane, di[(3-ethyl-3-oxetanyl)methyl]ether, 3-ethyl-3-(2-ethylhexyloxymethyl)oxetane, 3-ethyl-3-cyclohexyloxymethyl oxetane or phenol novolac oxetane, and the like. As the oxetane compound, it is possible to use, for example, 'ARON OXETANE OXT-101', 'ARON OXETANE OXT-121', 'ARON OXETANE OXT-211', 'ARON OXETANE OXT-221' or 'ARON OXETANE OXT-212', manufactured by Toagosei Co., Ltd., and the like. The oxetane compounds may be used either alone or in combination of two or more thereof.

The content of the oxetane compound may be preferably 15 to 80 wt %, and more preferably 40 to 60 wt %, with respect to the total weight of the UV-curable ink composition. When the content exceeds 80 wt %, the degree of cure is low, and when the content is less than 15 wt %, the viscosity is increased, and as a result, the coatability deteriorates.

Further, the oxetane compound of the present invention may be used while comprising an oxetane compound having one oxetane ring and an oxetane compound having two oxetane rings. When the oxetane compound having one oxetane ring and the oxetane compound having two oxetane rings are together used, there is an advantage in that the viscosity and the flexibility of the film may be adjusted. When two oxetane compounds are together used as described above, it is preferred to use the two oxetane compounds in a content range of the oxetane compound having one oxetane ring to the oxetane compound having two oxetane rings of 1:1.16 to 1:3.

Further, the present invention has a content ratio of the epoxy compound to the oxetane compound of 1:0.5 to 1:6. When the ratio of the epoxy compound and the oxetane compound exceeds 1:6, the coatability of the composition is excellent as the viscosity of the composition is low, but the curing sensitivity may deteriorate. When the ratio is less than 1:0.5, the coatability may deteriorate as the viscosity of the composition is high.

The ink composition of the present invention comprises a compound which produces a cationic species or a Bronsted acid by irradiation of UV rays as a cationic photopolymerization initiator, for example, an iodonium salt or a sulfonium salt, but is not limited thereto.

The iodonium salt or sulfonium salt causes a curing reaction in which monomers having an unsaturated double bond contained in ink are reacted to form a polymer during the UV curing process to occur. A photosensitizer may also be used according to the polymerization efficiency.

As an example, the photopolymerization initiator may be a photopolymerization initiator having an anion represented by $SbF_6^-$, $AsF_6^-$, $BF_6^-$, $(C_6F_5)_4B^-$, $PF_6^-$ or $RfnF_{6-n}$, but is not limited thereto.

The photopolymerization initiator may be contained in an amount of preferably 1 to 15 wt %, and more preferably 2 to 10 wt %, with respect to the total weight of the UV-curable ink composition. When the content of the photopolymerization initiator is less than 1 wt %, the curing reaction is not sufficient, and when the content exceeds 15 wt %, the photopolymerization initiator is not all dissolved, or the viscosity is increased, and as a result, the coatability may deteriorate.

The ink composition may further comprise a diluent for improving the coating property by lowering the viscosity of the ink to increase the flowability.

Examples of the diluent comprise at least one selected from the group consisting of methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxypropanol, 2-methoxypropanol, 2-ethoxyethanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate, but are not necessarily limited thereto.

The content of the diluent is preferably 0 to 30% by weight, more preferably 0.1 to 20% by weight based on the total weight of the UV curable ink composition. If it is more than 30% by weight, the curing sensitivity is lowered.

The UV-curable ink composition comprises a colorant.

As the colorant, one or more pigments, dyes, or mixtures thereof may be used, and the colorant is not particularly limited as long as the colorant may express a color if necessary.

As an exemplary embodiment of the present invention, it is possible to use carbon black, graphite, metal oxides, an organic black pigment, and the like as a black pigment.

Examples of carbon black may comprise SEAST 5HIISAF-HS, SEAST KH, SEAST 3HHAF-HS, SEAST NH, SEAST 3M, SEAST 300HAF-LS, SEAST 116HMMAF-HS, SEAST 116MAF, SEAST FMFEF-HS, SEAST SOFEF, SEAST VGPF, SEAST SVHSRF-HS and SEAST SSRF (Tokai Carbon Co., Ltd.); DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (Mitsubishi Chemical Corp.); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (Colombia Carbon Co., Ltd.) or mixtures thereof, and the like.

As the organic black pigment, aniline black, lactam black or perylene black series, and the like may be used, but the organic black pigment is not limited thereto.

In the present invention, the UV-curable ink composition is cured by irradiation of UV rays with a long wavelength (for example, 360 to 410 nm), and thus has a certain level of optical density (OD). For this purpose, the content of the colorant may be preferably 1 to 15 wt %, and more preferably 3 to 10 wt %, with respect to the total weight of the UV-curable ink composition. When the content of the colorant is less than 1 wt %, a level of OD which is applicable to the bezel may not be exhibited, and when the content exceeds 15 wt %, an excessive amount of the colorant may not be dispersed in ink, and a precipitate may be formed.

When the content of the colorant is within the range, the OD may be maintained in a range of 0.2 to 5.

The ultraviolet curable ink composition comprises a surfactant that lowers the surface tension of the ink composition to exhibit a small taper angle.

As a surfactant, commercially available products may be used, and for example, it is possible to use those selected from the group consisting of Megafack F-444, F-475, F-478, F-479, F-484, F-550, F-552, F-553, F-555, F-570, RS-75, which are manufactured by DaiNippon Ink & Chemicals (DIC), Inc., Surflon S-111, S-112, S-113, S-121, S-131, S-132, S-141 and S-145, which are manufactured by Asahi Glass Co., Ltd., or Fluorad FC-93, FC-95, FC-98, FC-129, FC-135, FC-170C, FC-430 and FC-4430, which are manufactured by Sumitomo 3M, Co., Ltd., Zonyl FS-300, FSN, FSN-100 and FSO, which are manufactured by Dupont Co., BYK-306, BYK-310, BYK-320, BYK-330, BYK-331, BYK-333, BYK-342, BYK-350, BYK-354, BYK-355, BYK-356, BYK-358N, BYK-359, BYK-361N, BYK-381, BYK-370, BYK-371, BYK-378, BYK-388, BYK-392, BYK-394, BYK-399, BYK-3440, BYK-3441, BYKETOL-AQ, BYK-DYNWET 800, BYK-SILCLEAN 3700 and BYK-UV 3570, which are manufactured by BYK Chemie, and Rad 2100, Rad 2011, Glide 100, Glide 410, Glide 450, Flow 370 and Flow 425, which are manufactured by Tego company.

The surfactant is preferably contained in an amount of 0.1 to 5.0% by weight, more preferably 0.5 to 3.0% by weight based on the total weight of the UV curable ink composition. When the content of the surfactant is less than 0.1% by weight, the effect of lowering the surface tension of the composition is insufficient, resulting in coating failure when the composition is coated on the substrate. When the content exceeds 5.0% by weight, the surfactant is excessively used resulting in causing a problem that the compatibility and the defoaming property of the composition are rather reduced.

The UV-curable ink composition may further comprise a photosensitizer in order to complement the curability by the active energy ray having a long wavelength.

The photosensitizer may be one or more selected from the group consisting of anthracene-based compounds, such as anthracene, 9,10-dibutoxy anthracene, 9,10-dimethoxy anthracene, 9,10-diethoxy anthracene, and 2-ethyl-9,10-dimethoxy anthracene; benzophenone-based compounds, such as benzophenone, 4,4-bis(dimethylamino)benzophenone, 4,4-bis(diethylamino)benzophenone, 2,4,6-trimethylaminobenzophenone, methyl-o-benzoylbenzoate, 3 ,3-dimethyl-4-methoxybenzophenone, and 3,3,4,4-tetra(t-butylperoxycarbonyl)benzophenone; acetophenone; ketone-based compounds, such as dimethoxy acetophenone, diethoxy acetophenone, 2-hydroxy-2-methyl-1-phenylpropan-1-one, and propanone; perylene; fluorenone-based compounds, such as 9-fluorenone, 2-chloro-9-fluorenone, and 2-methyl-9-fluorenone; thioxanthone-based compounds, such as thioxanthone, 2,4-diethylthioxanthone, 2-chlorothioxanthone, 1-chloro-4-propyloxythioxanthone, isopropylthioxanthone (ITX) and diisopropylthioxanthone; xanthone-based compounds, such as xanthone and 2-methylxanthone; anthraquinone-based compounds, such as anthraquinone, 2-methyl anthraquinone, 2-ethyl anthraquinone, t-butyl anthraquinone and 2,6-dichloro-9,10-anthraquinone; acridine-based compounds, such as 9-phenylacridine, 1,7-bis(9-acridinyl)heptane, 1,5-bis(9-acridinyl)pentane and 1,3-bis(9-acridinyl)propane; dicarbonyl compounds, such as benzyl, 1,7,7-trimethyl-bicyclo[2,2,1]heptane-2,3-dione and 9,10-phenanthrenequinone; phosphine oxide-based compounds, such as 2,4,6-trimethylbenzoyl diphenylphosphine oxide and bis(2,6-dimethoxybenzoyl)-2,4,4-trimethylpentyl phosphine oxide; benzoate-based compounds, such as methyl-4-(dimethylamino)benzoate, ethyl-4-(dimethylamino)benzoate, and 2-n-butoxyethyl-4-(dimethylamino)benzoate; amino synergists, such as 2,5-bis(4-diethylaminobenzal)cyclopentanone, 2,6-bis(4-diethylaminobenzal)cyclohexanone and 2,6-bis(4-diethylaminobenzal)-4-methyl-cyclohexanone; coumarin-based compounds, such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H,11H—Cl]-benzopyrano[6,7,8-ij]-quinolizin-11-one; chalcone compounds, such as 4-diethylaminochalcone and 4-azidobenzalacetphenone; 2-benzoylmethylene; and 3-methyl-b-naphthothiazoline.

The photosensitizer is contained in an amount of preferably 1 to 200 parts by weight, and more preferably 10 to 100 parts by weight, with respect to 100 parts by weight of the photopolymerization initiator. There are problems in that when the content is less than 1 part by weight, the synergistic action of curing sensitivity may not be expected at a desired wavelength, and when the content exceeds 200 parts by weight, the photosensitizer is not dissolved and the adhesive force of the pattern and the crosslinking density deteriorate.

The UV-curable ink composition may further comprise an adhesion promoter as an additive.

The film attached on the bezel pattern repeatedly shrinks and expands depending on the use conditions such as temperature and humidity, so that stress is imposed on the bezel pattern, and as a result, the film and the bezel may be detached from a glass substrate. When one or more silane-based compounds selected from the group consisting of alkoxy silane-based compounds, epoxy silane-based compounds, aminophenyl silane-based compounds, amino silane-based compounds, mercapto silane-based compounds, and vinyl silane-based compounds are used as an adhesion promoter in order to prevent the fall-off, an excellent result may be exhibited.

Among them, epoxy silane-based compounds are more preferred as the adhesion promoter of the present invention.

The adhesion promoter is contained in an amount of preferably 0.1 to 15 wt %, and more preferably 2 to 10 wt %, with respect to the total weight of the ink composition. There are problems in that when the content is less than 0.1 wt %, the bezel pattern cannot be prevented from being peeled off from the glass base material, and when the content exceeds 15 wt %, the viscosity of the ink solution is increased, and the dispersibility is low.

The UV-curable ink composition used in the present invention spreads within a short period of time immediately after inkjet printing, and thus exhibits excellent coating film characteristics, and the composition is cured to exhibit excellent adhesive characteristics. Therefore, when the UV-curable ink composition is applied, it is preferred to dispose a UV-lamp right behind the inkjet head such that the ink composition may be cured simultaneously with the inkjet printing.

Preferably, the use of UV-LEDs rather than mercury lamps can downsize the light source and facilitate equipment maintenance. More preferably, a long-wavelength UV-LED having a wavelength of 380 nm or more which reduces deterioration of the OLED or the liquid crystal device can be used as a light source. However, since the UV-LED generates light of a single wavelength, the kind and content of the photopolymerization initiator and the photosensitizer of the ink composition should be properly set.

The dose for curing the UV-curable ink composition is 20 to 5,000 mJ/cm$^2$, preferably 100 to 2,000 mJ/cm$^2$, and more preferably 500 to 1,500 mJ/cm$^2$.

The UV-curable ink composition is cured by absorbing radiation in a wavelength range of 250 nm to 450 nm, preferably 360 nm to 410 nm.

The UV-curable ink composition has a viscosity of 1 cP to 50 cP at 25° C., more preferably 3 cP to 30 cP at 25° C. as an example, and thus is suitable for the inkjet process. The ultraviolet curable ink composition having the viscosity range described above has good discharge at the process temperature. The process temperature means a temperature heated such that the viscosity of the curable ink composition can be reduced. The process temperature may be 10° C. to 100° C., preferably 20° C. to 70° C.

Further, the ultraviolet curable ink composition has excellent adhesion and coatability to an upper substrate.

The top portion of a bezel pattern formed by using the UV-curable ink composition is attached to a upper substrate through an adhesive layer for a upper substrate, and since the UV-curable ink composition exhibits excellent attaching force to an adhesive for a upper substrate, such as an acrylic adhesive, a styrene butadiene rubber-based adhesive, an epoxy adhesive, a polyvinyl alcohol-based adhesive, and a polyurethane-based adhesive, it is possible to obtain an effect in which the attaching force between the bezel pattern and the upper substrate is improved when the UV-curable ink composition is used.

The method for producing a bezel pattern of a display substrate according to the present invention uses the UV-curable ink composition.

Specifically, the method for producing a bezel pattern of a display substrate according to the present invention comprises: a) forming a bezel pattern on a substrate by using the UV-curable ink composition; and b) curing the bezel pattern.

In addition, the method for producing a bezel pattern of a display substrate according to the present invention may further comprise cleaning and drying the substrate prior to a) the forming of the bezel pattern. The cleaning and drying is for selectively carrying out a surface treatment depending on the surface energy of the substrate in order to improve coating properties of the ink and remove stains caused by foreign substances.

Specifically, the surface treatment may be carried out by a treatment such as a wet surface treatment, a UV ozone treatment, and a normal pressure plasma treatment.

As the method for forming a bezel pattern on the substrate, it is possible to use a method selected from an inkjet printing using a UV-curable resin instead of photolithography and screen printing, a gravure coating, and a reverse offset coating. In order to applying the method, the ink composition of the present invention may have a viscosity of 1 cP to 50 cP, and preferably 3 cP to 45 cP.

In order to form a bezel pattern on a specific portion of the substrate by the aforementioned method, the ink composition having a low viscosity of 1 cP to 50 cP is applied at a height of 0.1 to 20 μm, and more specifically 0.5 to 5 μm. The applied composition is cured by exposure comprising UV rays, and as a result, a bezel pattern having a thin film thickness of 0.1 to 20 μm, and more specifically 0.5 to 5 μm may be manufactured.

The light source for curing the ultraviolet curable ink composition according to the present invention can be a mercury lamp, a high pressure mercury lamp, a metal halide lamp, or UV-LED light source, preferably a UV-LED light source, and more preferably a long-wavelength UV-LED light source of 380 nm or more, which gives less degradation to OLEDs or liquid crystal devices.

The bezel pattern has a taper angle of more than 0° and 30° or less and a thickness of 0.1 μm to 20 μm, which are measured after a curing treatment. Further, the taper angle may be preferably more than 0° and 10° or less. In addition, the thickness may be preferably 0.5 μm to 5 μm. The bezel pattern of the present invention has the aforementioned features, and thus may not exhibit a short-circuit due to a large step difference and deterioration in appearance quality due to generation of bubbles and release of the film.

The optical density of the bezel pattern may be 0.1 to 5 per a film thickness of 2.0 μm, and 0.5 to 2, if necessary. In this case, there is an advantage in that shielding characteristics due to the bezel pattern are excellent. When the optical density exceeds 5, the manufacture of ink and the inkjet process may be adversely affected because a required content of pigment to be introduced is very high, and it is possible to inhibit the UV-curable ink composition from being cured by radiation.

The present invention provides a bezel pattern of a display substrate manufactured by the above method. In the present invention, the bezel pattern refers to a pattern formed at the edges of various devices such as a clock, a display device.

The bezel pattern has a taper angle of more than 0° and 30° or less and a thickness of 0.1 μm to 20 μm, which are measured after a curing treatment. Further, the taper angle may be preferably more than 0° and 10° or less. In addition, the thickness may be preferably 0.5 μm to 50 μm. The bezel pattern of the present invention has the aforementioned features, and thus may not exhibit a short-circuit due to a large step difference and deterioration in appearance quality due to generation of bubbles and release of the film.

The optical density of the bezel pattern may be 0.05 to 2.5 based on a film thickness of 1.0 μm, and 0.25 to 1.0, if necessary. In this case, there is an advantage in that shielding characteristics due to the bezel pattern are excellent. When the optical density exceeds 2.5, the manufacture of ink and the inkjet process may be adversely affected because a required content of pigment to be introduced is very high, and it is possible to inhibit the UV-curable ink composition from being cured by radiation.

Furthermore, the present invention provides a display substrate comprising the bezel pattern.

The display device may be a display device used in any one of a plasma display panel (PDP), a light emitting diode (LED), an organic light emitting diode (OLED), a liquid crystal display (LCD) device, a thin film transistor-liquid crystal display (LCD-TFT) device, and a cathode ray tube (CRT).

MODE FOR INVENTION

Hereinafter, the present invention will be described in detail with reference to the Examples. The following Examples are provided for describing the present invention, and the scope of the present invention includes the scope described in the following claims and the substitution and modification thereof, and is not limited to the scope of the Examples.

EXAMPLES

The compositions for forming a bezel pattern in Examples 1 to 8 and Comparative Examples 1 to 3 were prepared by mixing the compositions as in the following Table 1 and stirring the compositions for 3 hours.

TABLE 1

| | Colorant A | Epoxy B | Oxetane C | Photopoly-merization initiator D | surfactant E | diluent G | photo-sensitizer H |
|---|---|---|---|---|---|---|---|
| Example | | | | | | | |
| 1 | A1:5 | B1:20 | C1:69 | D1:5 | E1:1 | — | — |
| 2 | A1:7.5 | B1:19 | C1:67.5 | D1:5 | E1:1 | — | — |
| 3 | A1:11 | B1:18 | C1:65 | D1:5 | E1:1 | — | — |
| 4 | A1:5 | B1:20 | C1:68 | D1:5 | E1:1 | — | H1:1 |
| 5 | A1:5 | B1:20 | C1:68 | D1:5 | E1:1 | — | H2:1 |
| 6 | A1:5 | B1:20 | C1:68 | D2:5 | E1:1 | — | H1: |
| 7 | A1:5 | B1:19 | C1:66 | D2:8 | E1:1 | — | H2:1 |
| 8 | A1:11 | B1:20 | C1:63 | D3:5 | E1:1 | — | — |
| Comparative Example | | | | | | | |
| 1 | A1:5 | B1:20 | C1:73.5 | D1:0.5 | E1:1 | — | — |
| 2 | A1:7.5 | B1:10 | C1:76.5 | D2:5 | E1:1 | — | — |
| 3 | A1:18 | B1:10 | C1:76.5 | D2:1 | E1:1 | — | H2:5 |

A1: Carbon black
B1: Celloxide 2021P (Daicel Corp.)
ARON OXETANE 221 (Toagosei Co., Ltd.)
D1: CPI-200K (San-Apro)
D2: Rhodorsil 2074 (Bluestar silicones)
D3: Irgacure 250 (BASF)
E1: BYK-330 (BYK chemie)
F1: 9,10-dibutoxyanthracene
F2: 2,4-diehtylthioxanthone Preparation Example 1

Manufacture of Bezel Pattern

The compositions prepared in Examples 1 to 8 and Comparative Examples 1 and 3 were coated on a cleaned LCD glass base material by the inkjet coating method to have a thickness of 2 μm after curing. Bezel patterns were formed by irradiating ultraviolet rays on the coating layer under the following conditions within 1 minute after the coating in order to prevent foreign substances from being attached and by curing the compositions. The ultraviolet irradiator used was a high-pressure mercury lamp with a wide UV-emitting wavelength range and a UV-LED lamp with a wavelength of 395 nm which emits light concentrated at a single wavelength. After a UV ray was irradiated, latex gloves were worn in order to determine whether the bezel pattern was cured, and then indentation and tackiness were observed by pressing the bezel pattern.

Preparation Example 2

Manufacture of Display Device Using Bezel Pattern

A bezel pattern was formed on the upper surface of the display panel (hereinafter, referred to as the panel) by the method in Preparation Example 1, and as an upper base material, an NRT polarization film manufactured by LG Chem., which used an acrylic adhesive layer, was attached thereto. After the attachment, the surroundings thereof were encapsulated by a sealant in order to prevent moisture and foreign substances from being incorporated into the cross section of the polarization film and the pattern.

Experimental Example 1

Viscosity

For the compositions prepared in Examples 1 to 8 and Comparative Examples 1 and 3, viscosities were measured. As a viscosity measurement apparatus, DV-III+ manufactured by Brookfield Industries, Inc. was used.

Experimental Example 2

Evaluation of OD of Bezel Pattern

The composition was coated on a general LCD glass substrate to a thickness of 1 μm according to Preparation Example 1, except that the spin coating was performed instead of the ink-jet coating, and OD was measured therefor using an X-rite OD measuring apparatus.

TABLE 2

| Example Conditions | Viscosity (cP) | Curing dose 1 high-pressure mercury lamp ⊚: less than 500 mJ/cm² ○: 500-1000 mJ/cm² Δ: 1000-3000 mJ/cm² X: no cure | Curing dose 2 395 nm UV-LED ⊚: less than 500 mJ/cm² ○: 500-1000 mJ/cm² Δ: 1000-3000 mJ/cm² X: no cure | OD value/ 1 μm |
|---|---|---|---|---|
| 1 | 16 | ⊚ | X | 0.3 |
| 2 | 20 | ○ | X | 0.48 |
| 3 | 42 | Δ | X | 0.75 |
| 4 | 16 | ⊚ | Δ | 0.3 |
| 5 | 16 | ⊚ | X | 0.3 |
| 6 | 16 | ○ | ○ | 0.3 |
| 7 | 17 | ⊚ | ⊚ | 0.3 |
| 8 | 15 | ○ | X | 0.75 |
| Comparative Examples | | | | |
| 1 | 13 | X | X | Not measurable |
| 2 | 67 | ○ | X | Not measurable |
| 3 | 14 | X | X | Not measurable |

Referring to Table 2, the curable ink compositions of Examples 1 to 8 had low viscosity and excellent curing sensitivity at the same time, which facilitated the formation of a bezel pattern. In particular, the curable ink compositions of Examples 4, 6 and 7 could be cured with a UV-LED that emits light of a single wavelength, which is suitable for manufacturing a bezel pattern without damage due to relatively strong energy and heat generation.

Unlike Examples 1 to 8, Comparative Examples 1 to 3, which did not satisfy the ratio of epoxy to oxetane of the present invention, exhibited markedly lower curing sensitivity than those of Examples. In particular, in Comparative Example 2, it was relatively good at the time of curing using a high-pressure mercury lamp, but it was confirmed that curing with a single wavelength UV-LED was impossible.

The invention claimed is:

1. A UV-curable ink composition for forming a bezel pattern, the composition comprising a colorant, an epoxy compound, an oxetane compound, a photopolymerization initiator, and a surfactant, wherein a content ratio of the epoxy compound to the oxetane compound is 1:3.4 to 1:6, a content of the oxetane compound is 60 to 75 wt % with respect to the total weight of the UV-curable ink composition, and the curing dose amount of the ultraviolet curable ink composition is 20 to 3,000 mJ/cm², at 395 nm UV-LED, and the taper angle is 0° to 10° after curing.

2. The UV-curable ink composition of claim 1, further comprising one or more selected from the group consisting of an adhesion promoter, a diluent, and a photosensitizer.

3. The UV-curable composition of claim 1, wherein the oxetane compound comprises an oxetane compound having one oxetane ring and an oxetane compound having two oxetane rings.

4. The UV-curable composition of claim 1, wherein a content of the epoxy compound is 5 to 50 wt % with respect to the total weight of the UV-curable ink composition.

5. The UV-curable composition of claim 1, wherein the photopolymerization initiator is an iodonium salt or a sulfonium salt.

6. The UV-curable composition of claim 1, wherein a content of the photopolymerization initiator is 1 to 15 wt % based on the total weight of the UV-curable ink composition.

7. The UV-curable composition of claim 1, wherein a content of the colorant is 1 to 15 wt % based on the total weight of the UV-curable ink composition.

8. The UV-curable composition of claim 2, wherein a content of the diluent is 0 to 30 wt % based on the total weight of the UV-curable ink composition.

9. The UV-curable composition of claim 1, wherein the surfactant is a fluorine-based surfactant.

10. The UV-curable composition of claim 9, wherein a content of the fluorine-based surfactant is 0.1 to 5.0 wt % based on the total weight of the UV-curable ink composition.

11. The UV-curable composition of claim 2, wherein the photosensitizer is comprised in an amount of 1 to 200 parts by weight based on 100 parts by weight of the photopolymerization initiator.

12. The UV-curable composition of claim 2, wherein the adhesion promoter is a epoxy silane-based compound.

13. The UV-curable composition of claim 2, wherein the adhesion promoter is comprised in an amount of 0.1 to 15 wt % based on the total weight of the UV-curable ink composition.

14. The UV-curable composition of claim 1, wherein a dose for curing the UV-curable ink composition is 100 to 2,000 mJ/cm$^2$.

15. The UV-curable composition of claim 1, wherein a dose for curing the UV-curable ink composition is 500 to 1,500 mJ/cm$^2$.

16. The UV-curable composition of claim 1, wherein the UV-curable ink composition has a viscosity of 1 cp to 50 cp at 25° C.

17. The UV-curable composition of claim 16, wherein the UV-curable ink composition has a viscosity of 3 cp to 45 cp at 25° C.

18. A method for producing a bezel pattern for a display substrate, comprising:
   a) forming a bezel pattern on a substrate by using the UV-curable ink composition of claim 1; and
   b) curing the bezel pattern.

19. The method of claim 18, further comprising cleaning and drying the substrate prior to a) the forming of the bezel pattern.

20. The method of claim 19, wherein the cleaning and drying of the substrate is carried out by one or more treatments selected from the group consisting of a wet surface treatment, a UV ozone treatment, and a normal pressure plasma treatment.

21. The method of claim 18, wherein the method of forming the bezel pattern on the substrate in Step a) is a method selected from an inkjet printing, a gravure coating, and a reverse offset coating.

22. The method of claim 18, wherein Step a) is carried out at a process temperature of 10° C. to 100° C.

23. The method of claim 22, wherein Step a) is carried out at a process temperature of 20° C. to 70° C.

24. The method of claim 18, wherein the Step b) is performed by using a light source that emits light of a single wavelength having a full width at half maximum (FWHM) of 50 nm or less.

25. The method of claim 24, wherein the light source is a UV-LED light source or an OLED light source.

26. The method of claim 24, wherein the light source that emits light of a single wavelength has a center wavelength of 360 to 410 nm.

27. The method of claim 18, wherein the bezel pattern has a thickness of 0.1 μm to 20 μm.

28. The method of claim 27, wherein the bezel pattern has a thickness of 0.5 μm to 5 μm.

29. The method of claim 18, wherein the bezel pattern has an OD value of 0.05 to 2.5 per a film thickness of 1.0 μm.

30. A bezel pattern for a display substrate, which is formed on a substrate by curing the UV-curable ink composition of claim 1.

31. The bezel pattern of claim 30, wherein the bezel pattern has a thickness of 0.1 μm to 20 μm.

32. The bezel pattern of claim 31, wherein the bezel pattern has a thickness of 0.5 μm to 5 μm.

33. The bezel pattern of claim 30, wherein the bezel pattern has an OD value of 0.05 to 2.5 per a film thickness of 1.0 μm.

* * * * *